(12) United States Patent
Sakai et al.

(10) Patent No.: US 8,188,605 B2
(45) Date of Patent: *May 29, 2012

(54) COMPONENTS JOINING METHOD AND COMPONENTS JOINING STRUCTURE

(75) Inventors: Tadahiko Sakai, Fukuoka (JP); Hideki Eifuku, Fukuoka (JP); Yoshiyuki Wada, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/192,931

(22) Filed: Jul. 28, 2011

(65) Prior Publication Data

US 2011/0284265 A1 Nov. 24, 2011

Related U.S. Application Data

(63) Continuation of application No. 12/279,026, filed as application No. PCT/JP2007/057801 on Apr. 3, 2007, now Pat. No. 8,018,074.

(30) Foreign Application Priority Data

Apr. 3, 2006 (JP) .................................. 2006-101778

(51) Int. Cl.
    *H01L 23/48* (2006.01)
(52) U.S. Cl. ......................... 257/779; 257/783; 257/788
(58) Field of Classification Search .................. 257/779, 257/783, 788
See application file for complete search history.

(56) References Cited

U.S. PATENT DOCUMENTS

| 5,136,365 A | 8/1992 | Pennisi et al. |
| 5,447,267 A | 9/1995 | Sakai et al. |
| 6,179,198 B1 | 1/2001 | Eifuku et al. |

(Continued)

FOREIGN PATENT DOCUMENTS

EP  1 615 263 A1  1/2006

(Continued)

OTHER PUBLICATIONS

International Search Report for PCT/JP2007/057801; Jul. 20, 2007.

*Primary Examiner* — Cathy Lam
(74) *Attorney, Agent, or Firm* — Pearne & Gordon LLP

(57) ABSTRACT

To provide a components joining method and a components joining structure which can realize joining of components while securing conduction at a low electrical resistance with high reliability.

In a construction in which by using a solder paste containing solder particles 5 in a thermosetting resin 3a, a rigid substrate 1 and a flexible substrate 7 are bonded by the thermosetting resin 3a, and a first terminal 2 and a second terminal 8 are electrically connected by the solder particles 5, a blending ratio of an activator of the thermosetting resin 3a in the solder paste is properly set and oxide film removed portions 2b, 8b, and 5b are partially formed in oxide films 2a, 8a, and 5a of the first terminal 2, the second terminal 8, and the solder particles 5. Thereby, the first terminal 2 and the second terminal 8 are electrically conducted by solder bonding the solder particles 5 to both the first terminal 2 and the second terminal 8 via the oxide film removed portions 2b and 8b, and while fusion of the solder particles 5 with each other is prevented in the thermosetting resin 3a, connection of components at a low electrical resistance is realized with high reliability.

8 Claims, 4 Drawing Sheets

U.S. PATENT DOCUMENTS

| | | |
|---|---|---|
| 6,209,196 B1 | 4/2001 | Ozono et al. |
| 7,221,050 B2 * | 5/2007 | Palanduz .................. 257/701 |
| 7,632,710 B2 | 12/2009 | Sakai et al. |
| 2005/0056687 A1 | 3/2005 | Matsumoto et al. |
| 2006/0043543 A1 | 3/2006 | Wada et al. |

FOREIGN PATENT DOCUMENTS

| | | |
|---|---|---|
| EP | 1 734 801 A1 | 12/2006 |
| JP | 11-004064 A | 1/1999 |
| JP | 2000-094179 A | 4/2000 |

* cited by examiner

COMPONENTS JOINING METHOD AND COMPONENTS JOINING STRUCTURE

This application is a continuation of U.S. patent application Ser. No. 12/279,026 filed Aug. 11, 2008, which is incorporated herein by reference in its entirety.

TECHNICAL FIELD

The present invention relates to a components joining method and a components joining structure for joining components including terminals whose surfaces are covered by natural oxide films to each other by using a solder paste.

BACKGROUND ART

In the field of electronic devices, as a method for joining components to each other, an anisotropic conductive agent containing conductive particles made of gold or balls whose surfaces are covered by gold in a resin adhesive is conventionally used. This method is advantageous in that conduction between terminals and bonding of components to each other are realized at the same time by thermally compression-bonding connecting portions in a state that an anisotropic conductive agent is supplied to the connecting portions to interpose conductive particles between terminals to be connected. This components joining by using an anisotropic conductive agent has the above-described advantage, however, it has problems in cost such as a high material cost and in conduction stability due to conduction between the terminals realized by contact between the conductive particles, and this is not suitable for use that requires low electrical resistance and high reliability. To solve these problems, a resin adhesive containing solder particles in a resin adhesive instead of the conventional conductive particles has been suggested (for example, refer to Patent document 1).

[Patent document 1] Japanese Unexamined Patent Publication No. 11-4064

DISCLOSURE OF THE INVENTION

However, in the above-described example of the patent document, depending on the state of electrodes and bumps to be joined, stable solder joining is hardly secured. That is, the surfaces of the electrode and the bump are not always clean, and in many cases, the surfaces of the solder particles are covered by oxide films in general. Therefore, even if such solder particles are interposed between the electrode and the bump and then thermal compression bonding is performed, the solder particles are temporarily molten, however, a solder joining portion which electrically conducts the electrode and the bump at a low electrical resistance cannot be stably formed.

To improve such a joining failure, when a flux composition is blended in the resin adhesive for the purpose of removing the oxide films at the joining portion, the solder joining performance between the electrode and the bump is improved, however, the possibility of the following problem increases. That is, the flux composition acts on all solder particles in the adhesive, so that when the remaining solder particles melt, these molten solder particles fuse with each other and flow, and easily cause a bridge between electrodes. This tendency becomes conspicuous especially when fine-pitch components whose pitches between electrodes are narrow are joined. Thus, conventionally, it is difficult to realize components joining while securing conduction at a low electrical resistance with high reliability.

Therefore, an object of the present invention is to provide a components joining method and a components joining structure which can realize components joining while securing conduction at a low electrical resistance with high reliability.

The components joining method of the present invention is for electrically connecting a first terminal and a second terminal which are provided on a first part and a second part, respectively, and have at least either one of the surfaces covered by natural oxide films, to each other, and bonding the first part and the second part to each other, including the steps of: interposing a solder paste containing solder particles consisting mainly of tin (Sn) in a thermosetting resin between the first part and the second part; and electrically connecting the first terminal and the second terminal by the solder particles by pressing the first terminal and the second terminal against each other while heating the first part and/or the second part and bonding the first part and the second part to each other by curing the thermosetting resin, wherein the solder paste contains acid anhydride as a curing agent for curing the thermosetting resin, and further contains an activator which removes the natural oxide films and oxide films of the solder particles, at a ratio not more than 1 weight percent to a remainder excluding the solder particles.

The components joining method of the present invention is for electrically connecting a first terminal and a second terminal which are provided on a first part and a second part, respectively, and have at least either one of the surfaces covered by natural oxide films, to each other, and bonding the first part and the second part to each other, comprising the steps of: interposing a solder paste containing solder particles consisting mainly of tin (Sn) in a thermosetting resin between the first part and the second part; and electrically connecting the first terminal and the second terminal by the solder particles by pressing the first terminal and the second terminal against each other while heating the first part and/or the second part and bonding the first part and the second part to each other by curing the thermosetting resin, wherein the solder paste contains a latent curing agent for curing the thermosetting resin, and further contains an activator which removes the natural oxide films and oxide films of the solder particles, at a ratio of 1 to 5 weight percent with respect to a remainder excluding the solder particles.

The components joining structure of the present invention is formed by interposing a solder paste containing solder particles consisting mainly of tin (Sn) in a thermosetting resin between the first part and the second part and heating the first part and/or the second part, and pressing a first terminal and a second terminal which are provided on the first part and the second part, respectively, and have at least either one of the surfaces covered by natural oxide films, against each other, including: solder portions which are formed by melting the solder particles and being solder-bonded to both of the first terminal and the second terminal to electrically connect the first terminal and the second terminal to each other; and a resin portion which is formed by curing the thermosetting resin, and bonds the first part and the second part to each other, and includes the solder particles that do not contribute to the formation of the solder portions in a state that the solder particles are not fused with each other.

According to the present invention, by using a solder paste containing a thermosetting resin in which solder particles are contained, a first terminal and a second terminal provided on a first part and a second part, respectively, are electrically connected by the solder, and the first part and the second part are bonded to each other by curing the thermosetting resin, wherein by properly setting a blending ratio of the curing agent of the thermosetting resin and the activator in the solder paste, the terminals are stably electrically connected to each other by the solder bonding, and fusion of the solder particles is prevented in the thermosetting resin, whereby joining of the components while securing conduction at a low electrical resistance is realized with high reliability.

BEST MODE FOR CARRYING OUT THE PRESENT INVENTION

Next, an embodiment of the present invention will be described with reference to the drawings. First, with reference to FIGS. 1(a) to 1(c) and FIGS. 2(a) to 2(c), the components joining method will be described. This components joining method is for joining a flexible substrate as a second part to a rigid substrate as a first part, and according to this method, a first terminal and a second terminal provided on the respective substrates are electrically connected to each other and the rigid substrate and the flexible substrate are bonded to each other.

Figure 1:
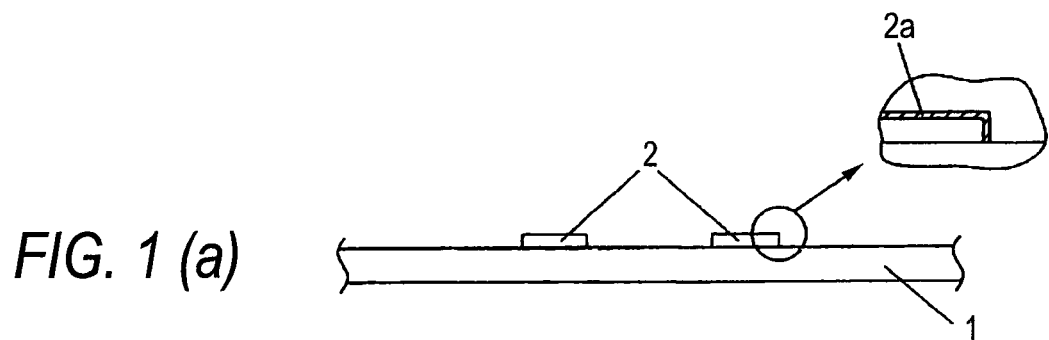
FIGS. 1(a) to 1(c) are process explanatory views of a components joining method of an embodiment of the present invention.
Figure 1:
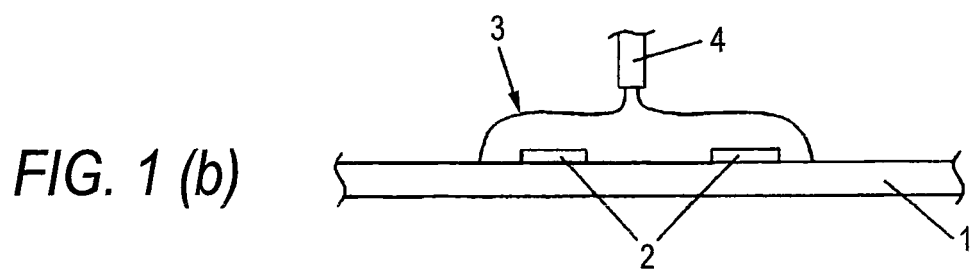
Figure 1:
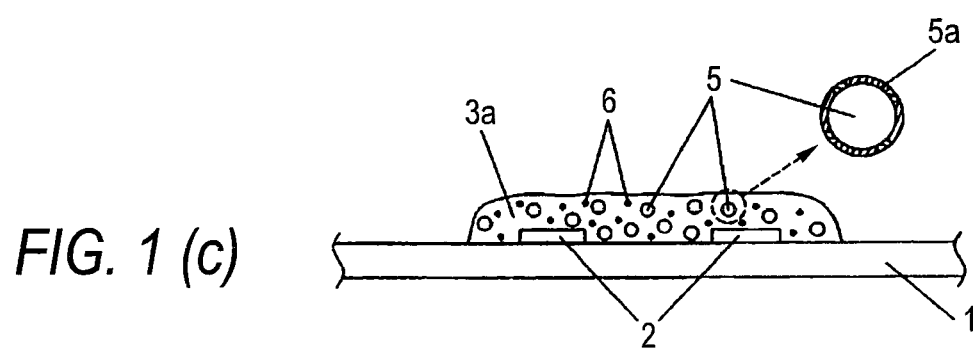

As shown in FIG. 1(a), on the rigid substrate, first terminals 2 are formed. The first terminals 2 are made of copper (Cu) or a copper-based alloy, and the surfaces of the first terminals 2 are covered by oxide films 2a (natural oxide films) generated by exposure to the atmosphere. When joining the components, on the rigid substrate 1, on the connecting surface side on which the first terminals 2 are formed, as shown in FIG. 1(b), a solder paste 3 is applied to and coated on the first terminals 2 by a dispenser 4.

As shown in FIG. 1(c), the solder paste 3 contains solder particles 5 at a predetermined content ratio (hereinafter, 30 to 75 weight percent) in a thermosetting resin 3a, and as a curing agent for thermally curing the thermosetting resin 3a, contains acid anhydride or latent curing agent. Those usable herein as acid anhydride include methylhexahydrophthalic anhydride, and further, liquid acid anhydride such as nasic acid anhydride, methyltetrahydrophthalic anhydride, and solid acid anhydride such as phthalic anhydride and tetraohydrophthalate. Those usable as the latent curing agent include imidasol-based, hydrazide-based, boron trifluorideamine complex, amineimide, polyamine salt, amineadduct, dicyandiamide, etc.

As the thermosetting resin, an epoxy resin is most suitable, however, an acryl resin, a phenol resin, a urethane resin, or a silicone resin can also be used. Those usable as the epoxy resin in the present invention are not especially limited, and known epoxy resins are usable. For example, epoxy resins having two or more epoxy groups in one molecule such as a phenol novolac-type epoxy resin, a cresol novolac-type epoxy resin, a bisphenol A epoxy resin, a bisphenol F epoxy resin, a Glycidylamine-type epoxy resin, a cycloaliphatic epoxy resin, a halogenated epoxy resin are preferable, and at least one of these is selected and used.

The solder particles 5 are obtained by forming solder consisting mainly of tin (Sn) into particles with a predetermined particle size, and herein, by assuming general joining targets with 0.1 mm or more pitch between terminals, Sn—Ag—Cu-based solder formed into particles with a particle size of 10 to 30 micrometers are used. When components with a narrow pitch narrower than 0.1 mm between terminals are to be joined, to prevent electrical shortcircuits, solder particles with a particle size of 1 to 15 micrometers may be used.

Other than Sn—Ag—Cu-based solder, Sn, Sn—Ag-based, Sn—Pb-based, Sn—Pb—Ag-based, Sn—Bi-based, Sn—Bi—Ag-based, Sn—Bi—In-based, Sn—Cu-based, Sn—Ag—Cu—Sb-based, Sn—Ag—In—Bi-based, Sn—Zn-based, Sn—Zn—Bi-based, and Sn-in based solders are also usable. As the curing agent, a curing agent which thermally cures the thermosetting resin 3a at a curing temperature (for example, 230° C.) higher than the melting point temperature (220 degrees C.) of the solder used for the solder particles 5 is desirable.

The surfaces of the solder particles 5 are covered by oxide films 5a generated due to exposure to the atmosphere after production, and to solder-bond the solder particles 5 in this state to the first terminals 2 covered by the oxide films 2a, the solder paste 3 is blended with an activator 6 having the action of removing the oxide films 2a and the oxide films 5a. In this embodiment, as the activator 6, N (2-hydroxyethyl) iminodiacetic acid, m-hydroxybenzoate, mesaconic acid, and furthermore, organic acids such as o-hydroxycinnamate, usnic acid, 3,4-dihydroxybezoate, m-hydroxybenzoate, hippuric acid, succinic acid, o-methoxycinnamate, p-anisic acid, lithocholic acid, and malic acid are used and blended at a ratio not more than 1 weight percent to a remainder excluding the solder particles 5.

In the solder paste 3, inorganic filler may be contained for the purpose of reducing the linear expansion coefficient. In this case, the following material formed into particles is blended at a ratio of 20 to 60 weight percent to a remainder excluding the solder particles 5. Those usable as the inorganic filler are crystalline silica, molten silica, synthetic silica, alumina, aluminum hydroxide, glass fiber, talc, calcium carbonate, titanium white, clay, and asbestos, etc., and in particular, crystalline silica, molten silica, synthetic silica, alumina, and aluminum hydroxide are preferable.

Figure 2:
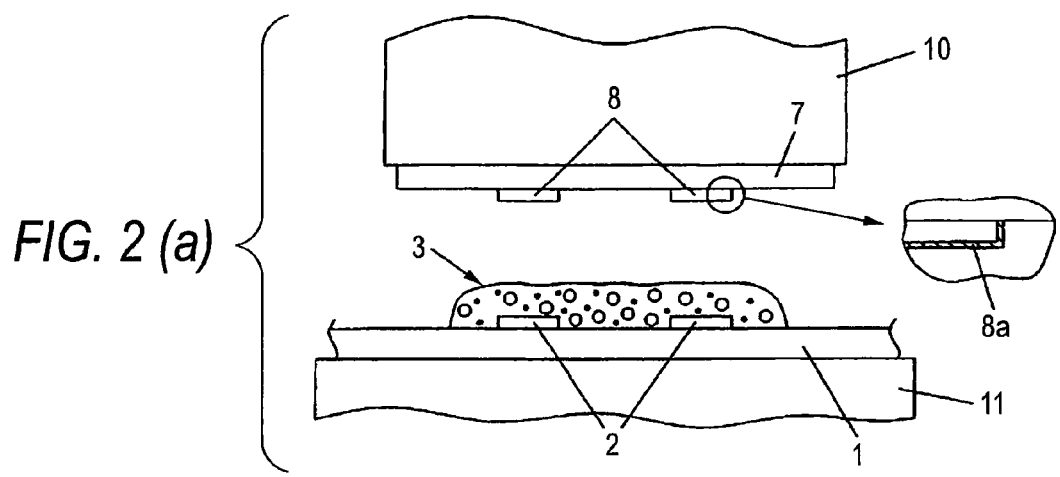
FIGS. 2(a) to 2(c) are process explanatory views of the components joining method of the embodiment of the present invention.
Figure 2:
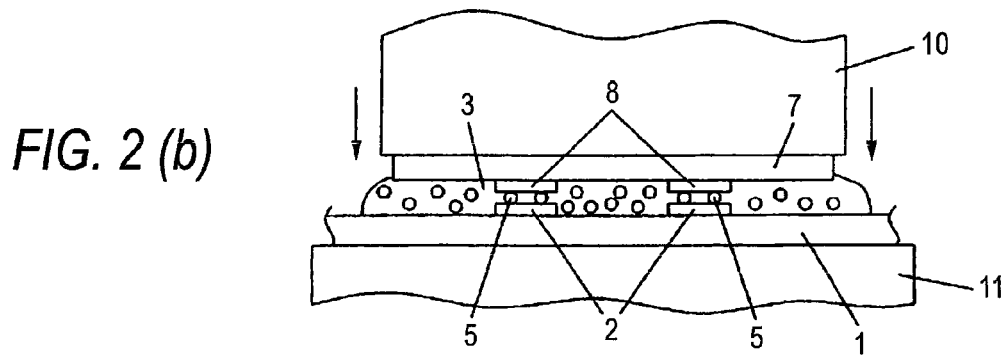
Figure 2:
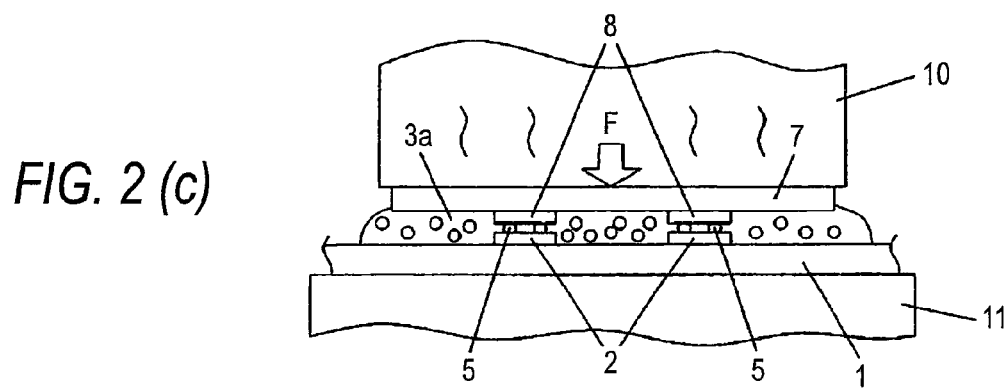

Thereafter, as shown in FIG. 2(a), the flexible substrate 7 is mounted on the rigid substrate 1 coated with a solder paste 3. On the lower surface of the flexible substrate 7, second terminals 8 made of the same material as that of the first terminals 2 are formed, and the second terminals 8 are covered by oxide films 8a (natural oxide films) similarly to the first terminals 2. When mounting the flexible substrate 7, the positions of the second terminals 8 of the rigid substrate 1 placed on a substrate supporting stage 11 are matched with the positions of the first terminals 2 of the flexible substrate 7 held by a pressure bonding tool 10, and as shown in FIG. 2(b), the pressure bonding tool 10 is lowered to press the second terminals 8 and the first terminals 2 against each other.

At this time, between the upper surface of the rigid substrate 1 and the lower surface of the flexible substrate 7, the solder paste 3 is interposed, and between the second terminals 8 and the first terminals 2, solder particles 5 contained in the solder paste 3 are present while being sandwiched therebetween. Herein, only two solder particles 5 are shown in the drawings, however, in actuality, particles with the above-described particle diameter are present in the order of several tens through several hundreds.

Next, thermal compression bonding for bonding the flexible substrate 7 to the rigid substrate 1 is executed. That is, as shown in FIG. 2(c), the temperature of the pressure bonding tool 10 is raised while pressing the flexible substrate 7 against the rigid substrate 1 at a predetermined pressing load F by the pressure bonding tool 10, and the flexible substrate 7 is heated at a temperature higher than the curing temperature of the thermosetting resin 3a. In this heating, at the time point at which the temperature rises and reaches the melting point temperature of the solder, first, the solder particles 5 in the solder paste 3 melt and electrically connect the first terminals 2 and the second terminals 8 to each other.

Then, after the solder particles 5 melt, the temperature is further raised, whereby the thermosetting resin 3a thermally cures and bonds the rigid substrate 1 and the flexible substrate 7 to each other. For thermal compression bonding, the part mounting shown in FIG. 2(b) and the thermal compression bonding shown in FIG. 2(c) may be performed in a series of working processes, or the part mounting and the thermal compression bonding may be performed in separate working processes. In the thermal compression bonding, only the flexible substrate 7 may be heated, or both of the rigid substrate 1 and the flexible substrate 7 may be heated.

The component joining method includes the steps of: interposing the solder paste 3 composed as described above between the rigid substrate 1 and the flexible substrate 7 by applying the solder paste onto the rigid substrate 1 so as to cover the first terminals 2; and electrically connecting the first terminals 2 and the second terminals 8 by the solder particles 5 by pressing the first terminals 2 and the second terminals 8 against each other while heating the rigid substrate 1 and/or the flexible substrate 7, and bonding the rigid substrate 1 and the flexible substrate 7 to each other by curing the thermosetting resin 3a. The curing temperature of the thermosetting resin 3a is set so that the thermosetting resin thermally cures at a temperature higher than the melting point temperature of the solder particles 5, and in the heating for thermal compression bonding, heating is performed at a temperature higher than the curing temperature of the thermosetting resin 3a.

Figure 3:
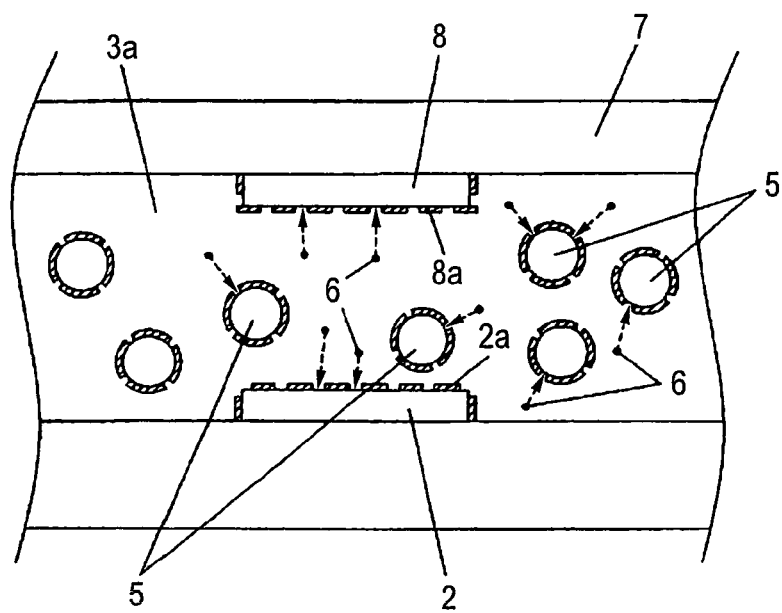
FIGS. 3(a) and 3(b) are process explanatory views of the components joining method of the embodiment of the present invention.
Figure 3:
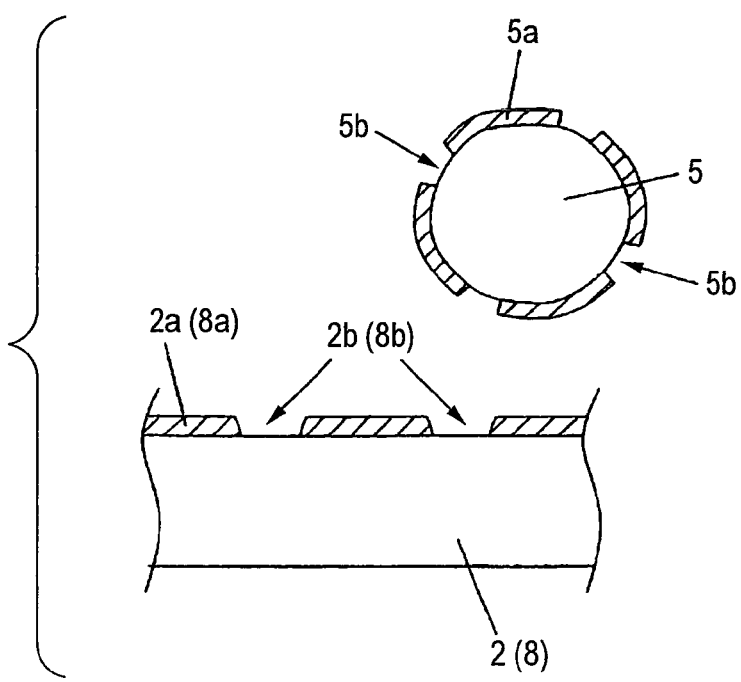
Figure 4:
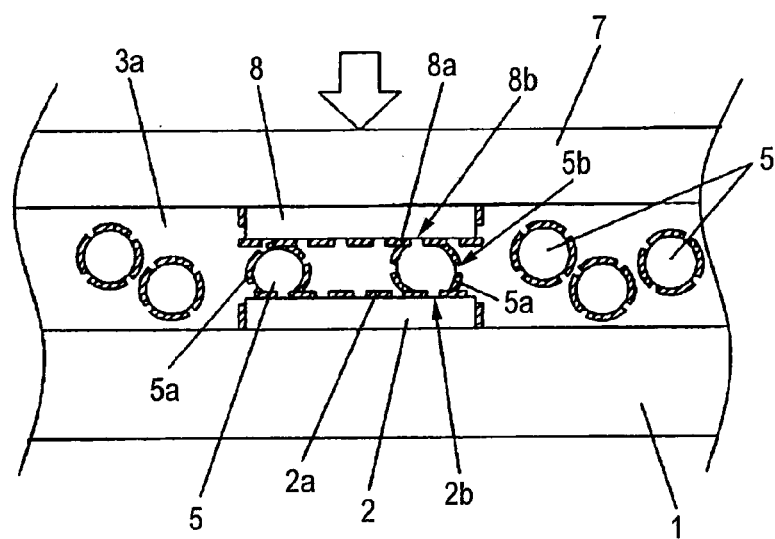
FIGS. 4(a) and 4(b) are sectional views of a components joining structure of an embodiment of the present invention.
Figure 4:
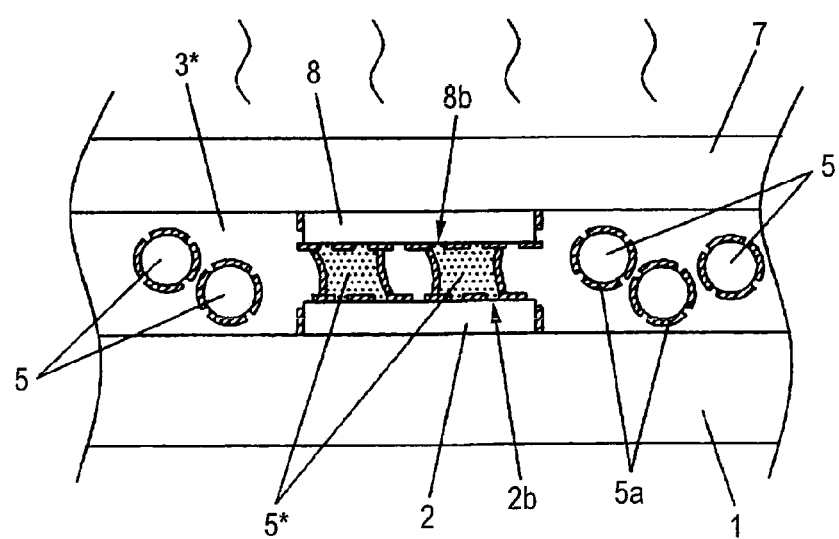

The surface state changes of the first terminals 2, the second terminals 8, and the solder particles 5 in the steps of part mounting and thermal compression bonding and the step of solder bonding will be described with reference to FIG. 3 and FIG. 4. FIG. 3(a) shows a state that the flexible substrate 7 is lowered to the rigid substrate 1 and the second terminals 8 are in contact with the solder paste 3. In this state, the activator 6 in the solder paste 3 acts on the oxide films 2a, 8a, and 5a, and the oxide films 2a, 8a, and 5a are partially removed.

At this time, the blending ratio of the activator 6 in the solder paste 3 is not more than 1 weight percent to the remainder excluding the solder particles 5, lower than that of the conventional example, so that the oxide film removal action of the activator 6 does not lead to action on the entire contact surfaces of the first terminals 2, the second terminals 8, and the solder particles 5 with the solder paste 3, and acts no further than partially removing the oxide films. Thereby, as shown in FIG. 3(b), on the surfaces of the first terminals 2, the second terminals 8, and the solder particles 5, oxide film removed portions 2b, 8b, and 5b where the oxide films 2a, 8a, and 5a are partially removed due to the action of the activator 6 are formed at a ratio corresponding to the blending ratio of the activator 6.

Concerning these oxide film removed portions, the oxide film removed portions 5b of the solder particles 5 are formed when the solder paste 3 is prepared by blending the solder particles 5 in the thermosetting resin 3a together with the activator 6. The oxide film removed portions 2b of the first terminals 2 are formed when the solder paste 3 is applied onto the rigid substrate 1, and the oxide film removed portions 8b of the second terminals 8 are formed when the flexible substrate 7 is lowered and the second terminals 8 come into contact with the solder paste 3.

In a conventional solder paste which is used for the same purpose as that of the solder paste 3 and contains solder particles in the same manner, under the technical idea that the oxide films on the surface of the solder particles must be completely or almost completely removed at the solder bonding step, the blending ratio of the activator for removing the oxide films is determined, and at least 7 weight percent of the activator must be blended. On the other hand, in the solder paste 3 shown in this embodiment, the blending ratio of the activator is set to 1 weight percent which is lower than the conventional ratio, and thereby, oxide film removal is limited to be partial and an excellent effect described below is obtained.

FIG. 4(a) shows a state that the solder particles 5 are sandwiched and pressed between the first terminal 2 and the second terminal 8 in this state. As described above, large portions of the surfaces of the first terminal 2, the second terminal 8, and the solder particles 5 are covered by the oxide films 2a, 8a, and 5a, so that the solder particles 5 and the first terminal 2 and the second terminal 8 are not in a state that their new phases are entirely in contact with each other.

However, between the second terminal 8 and the first terminal 2, the solder particles 5 are present in the order of several tens through several hundreds, so that stochastically, oxide film removed portions 5b of at least several solder particles 5 coincide with or are proximal to the positions of the oxide film removed portions 2b and the oxide film removed portions 8b. Then, the solder particles 5 are sandwiched and pressed between the first terminal 2 and the second terminal 8, the oxide films 5a on the contact portions are partially destroyed, and the new phases of the solder particles 5 and the new phases of the first terminal 2 and the second terminal 8 are partially in contact with each other with high probability.

Then, at the solder bonding step at which the solder particles 5 melt due to heating, the molten solder becomes wet and spreads in the ranges including the oxide film removed portions 2b and the oxide film removed portions 8b on the surfaces of the first terminal 2 and the second terminal 8. At this time, the molten solder of the solder particles 5 are solder-bonded to new phases of the first terminal 2 and the second terminal 8 although this bonding is partial, and thereby, solder portions 5* which electrically connect the first terminal 2 and the second terminal 8 to each other are formed. At this time, by selecting a curing agent so that the thermal curing temperature of the thermosetting resin 3a becomes higher than the melting point temperature of the solder particles 5, the thermosetting resin 3a is prevented from disturbing the fluidity of the solder particles 5 when they melt, and wetting and spreading of the solder particles 5 can be secured and more excellent solder portions 5* can be obtained.

In the gap sandwiched between the rigid substrate 1 and the flexible substrate 7, in a portion other than the portion in which the first terminal 2 and the second terminal 8 face each other, solder particles 5 which did not contribute to the formation of the solder portions 5* are present while being included in a resin portion 3* formed by thermally curing the thermosetting resin 3a. These semiconductor particles 5 are not entirely influenced by the action of the activator 6 as described above, the solder particles 5 maintains the state that the large portions of the surfaces thereof are covered by oxide films 5a which were not removed by the activator 6 and remain.

Therefore, the probability that the solder particles 5 in proximity to each other in the thermosetting resin 3a melt and wet each other and fuse with each other is low, so that it is effectively prevented that a number of solder particles 5 are fused with each other in the thermosetting resin 3a and forms a solder bridge that connects the first terminals 1 or the second terminals 8 to each other by the molten solder. This means that even if the blending ratio of the conductive particles is set to be higher than normal in the anisotropic conductive agent containing solder particles 5 as conductive particles in the thermosetting resin 3a, the insulating properties are not deteriorated. Therefore, the antinomy in which the insulating properties are deteriorated if the density of the conductive particles is increased for the purpose of improving the conduction can be solved.

That is, the components joining structure which is realized by the components joining method of this embodiment includes, as shown in FIG. 4(b), solder portions 5* which are formed by melting and solder-bonding the solder particles 5 to both the first terminal 2 and the second terminal 8, and electrically connect the first terminal 2 and the second terminal 8 to each other, and a resin portion 3* which is formed by curing the thermosetting resin 3a, bonds the rigid substrate 1 and the flexible substrate 7 to each other, and includes solder particles 5 which do not contribute to the formation of the solder portions 5* in a state that the solder particles 5 are not fused with each other. The surfaces of the solder particles 5 which did not contribute to the formation of the solder portions 5* are covered by oxide films 5a which were not removed by the activator 6 and remain.

As described above, in the components joining method of this embodiment, by properly setting the blending ratio of the activator 6 in the solder paste 3 in combination with the content ratio of the solder particles 5, the surface state of the solder particles 5, that is, the degree of removal of the oxide films 5a is set so that the first terminal 2 and the second terminal 8 are stably electrically conducted to each other by the solder bonding and a number of solder particles 5 are prevented from being fused with each other and forming solder bridges in the resin portion 3*. The combination of the blending ratio of the activator 6 and the content ratio of the solder particles 5 to satisfy these conditions is empirically found through a test for evaluating the components joining performance described below.

Results of evaluation on the components joining performance of the solder paste performed for this purpose will be described with reference to (Table 1).

TABLE 1

<solder paste basic data>
Solder composition: Sn—Ag—Cu based
Grain size: 10-30 μm
Resin: Epoxy resin
Curing agent: acid anhydride
Activator: organic acids

| activator blending ratio | solder content ratio | short-circuit | conduction | particle fusion | Overall |
|---|---|---|---|---|---|
| 0% | 5 | G | NG | G | NG |
|  | 15 | G | NG | G | NG |
|  | 30 | G | G | G | G |
|  | 45 | G | G | G | G |
|  | 60 | G | G | G | G |
|  | 75 | G | G | G | G |
|  | 90 | NG | G | NG | NG |

TABLE 1-continued

<solder paste basic data>
Solder composition: Sn—Ag—Cu based
Grain size: 10-30 μm
Resin: Epoxy resin
Curing agent: acid anhydride
Activator: organic acids

| activator blending ratio | solder content ratio | short-circuit | conduction | particle fusion | Overall |
|---|---|---|---|---|---|
| 1% | 5 | G | NG | G | NG |
|  | 15 | G | NG | G | NG |
|  | 30 | G | G | G | G |
|  | 45 | G | G | G | G |
|  | 60 | G | G | G | G |
|  | 75 | G | G | G | G |
|  | 90 | NG | G | NG | NG |
| 3% | 5 | G | NG | G | NG |
|  | 15 | G | NG | G | NG |
|  | 30 | NG | G | NG | NG |
|  | 45 | NG | G | NG | NG |
|  | 60 | NG | G | NG | NG |
|  | 75 | NG | G | NG | NG |
|  | 90 | NG | G | NG | NG |

The results of evaluation are a compilation of results of evaluation on a components joining structure which was obtained by executing components joining in actuality by using the solder paste 3 composed as shown in the solder paste basic data of Table 1. Herein, as described above, a solder paste 3 which contains solder particles 5 obtained by forming a solder with a Sn—Ag—Cu-based solder composition into particles with a particle diameter of 10 to 30 micrometers in a thermosetting resin 3a that mainly consists of an epoxy resin and contains acid anhydride as a curing agent and an organic acid as an activator, is used.

Herein, as test conditions, the activator blending ratio is changed to three ratios of 0%, 1%, and 3%, and at each of these activator blending ratios, the solder content ratio is changed to 7 ratios (5%, 15%, 30%, 45%, 60%, 75%, and 90%), and in these conditions, the components joining is executed in actuality. Then, concerning each of the obtained components joining structures, three items of "shortcircuit," "conduction," and "particle fusion" are evaluated.

"Shortcircuit" shows the results of electrical inspection on whether electrical shortcircuit has occurred between the first terminals 2 and between the second terminals 8, and "G" mark indicates that no shortcircuit has occurred, and "NG" mark indicates that shortcircuit has occurred. "Conduction" indicates whether the electrical resistance between the first terminal 2 and the second terminal 8 has cleared a required conduction level, and "G" mark indicates that the measured resistance is lower than the regulated resistance, and "NG" mark indicates that the measured resistance is higher than the regulated resistance.

"Particle fusion" indicates whether a number of solder particles 5 fused with each other in the solder are present in the resin portion 3*, and is evaluated by observing a section cut on an actual components joined portion. That is, "G" mark indicates that no particles fused with each other, and "NG" mark indicates particles fused with each other. This evaluation on "particle fusion" has the meaning of confirmation of occurrence tendency of the "shortcircuit" by observing the actual state of the solder particles 5. "Overall" is evaluation on the components joining performance by totalizing said three items, and a solder paste marked with "G" mark as evaluation in all three items is judged as passed overall in terms of components joining performance and marked with "G".

As understood from the evaluation results of (Table 1), when the activator blending ratio is 0% and 1% and at these ratios, the solder content ratio is between 30 weight percent and 75 weight percent, the overall evaluation is marked with "G". Herein, the reason for obtaining a satisfactory result even when the activator blending ratio is 0% is that acid anhydride blended as a curing agent also has a slight oxide film removing capability, and due to the presence of this acid anhydride, the oxide films of the first terminals 2, the second terminals 8, and the solder particles 5 are partially removed.

That is, as the solder paste 3, by using a solder paste 3 which contains solder particles 5 consisting mainly of tin (Sn) at a ratio of 30 through 75 weight percent in a thermosetting resin, contains acid anhydride as a curing agent for curing the thermosetting resin 3a, and contains an activator 6 for removing natural oxide films and oxide films 5a of the solder particles 5, at a ratio (0%, 1%) not more than 1 weight percent to a remainder excluding the solder particles 5, without short-circuit between terminals due to particle fusion of the solder particles 5 in the resin portion 3*, a components joining structure which has excellent conduction between the first terminal 2 and the second terminal 8 can be realized.

The composition of the solder paste 3 which realizes said components joining performance is not limited to the above-described example, and as the curing agent for curing the thermosetting resin 3a in the solder paste 3, a latent curing agent may be used. In this case, the optimal blending ratio of the activator for obtaining the same effect as described above is different from that in (Table 1), and the results shown in (Table 2) are obtained. Hereinafter, the evaluation results of (Table 2) will be described. The solder paste basic data shown herein are the same as in the examples of (Table 1) except for the kind of the curing agent.

TABLE 2

<solder paste basic data>
Solder composition: Sn—Ag—Cu based
Grain size: 10-30 µm
Resin: Epoxy resin
Curing agent: latent curing agent
Activator: organic acids

| activator blending ratio | solder content ratio | short-circuit | conduction | particle fusion | Overall |
|---|---|---|---|---|---|
| 0% | 5 | G | NG | G | NG |
| | 15 | G | NG | G | NG |
| | 30 | G | NG | G | NG |
| | 45 | G | NG | G | NG |
| | 60 | G | NG | G | NG |
| | 75 | G | NG | G | NG |
| | 90 | G | NG | G | NG |
| 1% | 5 | G | NG | G | NG |
| | 15 | G | NG | G | NG |
| | 30 | G | G | G | G |
| | 45 | G | G | G | G |
| | 60 | G | G | G | G |
| | 75 | G | G | G | G |
| | 90 | NG | G | NG | NG |
| 5% | 5 | G | NG | G | NG |
| | 15 | G | NG | G | NG |
| | 30 | G | G | G | G |
| | 45 | G | G | G | G |
| | 60 | G | G | G | G |
| | 75 | G | G | G | G |
| | 90 | NG | G | NG | NG |
| 7% | 5 | G | NG | G | NG |
| | 15 | G | NG | G | NG |
| | 30 | NG | G | NG | NG |
| | 45 | NG | G | NG | NG |
| | 60 | NG | G | NG | NG |
| | 75 | NG | G | NG | NG |
| | 90 | NG | G | NG | NG |

Herein, as test conditions, the activator blending ratio is changed to four ratios of 0%, 1%, 5%, and 7%, and at each of these activator blending ratios, the solder content ratio is changed to seven ratios (5%, 15%, 30%, 45%, 60%, 75%, and 90%), and in these conditions, components joining is executed in the same manner as in the example of (Table 1). Then, concerning each of the obtained components joining structures, according to the same method and criteria as in (Table 1), the three items of "shortcircuit," "conduction," and "particle fusion" are evaluated.

As understood from the evaluation results of (Table 2), when the activator blending ratio is 1% and 5%, and at these ratios, the solder content ratios are 30 weight percent to 75 weight percent, the overall evaluation is marked with "G". That is, as the solder paste 3, by using a solder paste 3 which contains solder particles consisting mainly of tin (Sn) at a ratio of 30 to 75 weight percent in a thermosetting resin, contains a latent curing agent for curing the thermosetting resin, and contains an activator 6 for removing natural oxide films and oxide films 5a of the solder particles 5, at a ratio of 1 weight percent to 5 weight percent to a remainder excluding the solder particles 5, similarly to the above-described example, without shortcircuit between terminals due to particle fusion of the solder particles 5 with each other in the resin portion 3*, a components joining structure which is excellent in conduction between the first terminal 2 and the second terminal 8 is realized.

Thus, in a construction in which the first terminal 2 and the second terminal 8 are electrically connected by solder by using the solder paste 3 containing solder particles 5 in a thermosetting resin 3a and the rigid substrate 1 and the flexible substrate 7 are bonded to each other by curing the thermosetting resin 3a, by properly setting the blending ratio of the activator of the thermosetting resin 3a in the solder paste 3 in the combination with the content ratio of the solder particles 5, the terminals can be stably electrically conducted by solder bonding, and shortcircuit caused by fusion of solder particles with each other in the thermosetting resin can be effectively prevented. Thereby, when components joining is performed so as to electrically conduct terminals or electrodes which are made of copper or a copper-based alloy at a low cost and covered by natural oxide films due to exposure to the atmosphere, the components joining which secures excellent conduction at a low electrical resistance can be realized with high reliability.

This embodiment describes an example in which the first terminal 2 as the first terminal and the second terminal 8 as the second terminal which are both made of a copper-based alloy and covered by natural oxide films are joined to each other, however, the present invention is not limited to this. For example, either one of the terminals may have a precious metal surface such as an electrode having a metal bump or gold-placed surface. That is, as long as the surface of at least either one of the first terminal or the second terminal is covered by a natural oxide film, the present invention is applicable.

Industrial Applicability

The components joining method and the components joining structure of the present invention bring about the effect that components joining which secures conduction at a low electrical resistance is realized with high reliability, and are applicable to mounting of electronic components on a substrate by means of solder bonding.

This application is based upon and claims the benefit of priority of Japanese Patent Application No. 2006-101778 filed on Apr. 3, 2007, the contents of which are incorporated herein by reference in its entirety.

The invention claimed is:

1. A components joining method for electrically connecting a first terminal and a second terminal to each other, wherein the first terminal and the second terminal are provided on a first part and a second part, respectively, and the surfaces of at least one of the first terminal and the second terminal are covered by natural oxide films, and bonding the first part and the second part to each other, comprising the steps of:
   interposing a solder paste containing solder particles consisting mainly of tin (Sn) in a thermosetting resin between the first part and the second part, wherein the solder particles are covered with oxide films; and
   electrically connecting the first terminal and the second terminal by the solder particles by pressing the first terminal and the second terminal against each other while heating the first part and/or the second part to form solder portions between the first terminal and the second terminal and bonding the first part and the second part to each other by curing the thermosetting resin,
   wherein the solder paste contains a latent curing agent for curing the thermosetting resin, and further contains an activator which removes the natural oxide films of the terminal surfaces and the oxide films of the solder particles, wherein the activator is contained in the solder paste in an amount of 1 to 5 weight percent for a portion of the solder paste excluding the solder particles,
   wherein the amount of the activator is set so that in the electrically connecting step the natural oxide film of the surfaces and the oxide films of the solder particles are partially but not completely removed and the solder particles that do not contribute the formation of the solder portions are covered by the remaining oxide films that are not removed by the activator and in the bonding step the thermosetting resin is cured while the surfaces are partially covered by the remaining natural oxide film and the solder particles are partially covered by the remaining oxide films.

2. The components joining method according to claim 1, wherein the first terminal and the second terminal are made of copper (Cu) or a copper-based alloy.

3. The components joining method according to claim 1, wherein the thermosetting resin thermally cures at a temperature higher than a melting point temperature of the solder.

4. The components joining method according to claim 1, wherein the heating is performed at a temperature higher than the curing temperature of the thermosetting resin.

5. A components joining structure formed by interposing a solder paste containing solder particles consisting mainly of tin (Sn) in a thermosetting resin between a first part and a second part, heating the first part and/or the second part, and pressing a first terminal and a second terminal against each other wherein the first terminal and the second terminal are provided on the first part and the second part, respectively to form solder portions between the first terminal and the second terminal, wherein the surfaces of at least one of the first terminal and the second terminal are covered by natural oxide films, wherein the solder particles are covered with oxide films, and the solder paste further contains an activator which removes the natural oxide films of the terminal surfaces and the oxide films of the solder particles, comprising:
   solder portions which are formed by melting the solder particles and being solder-bonded to both of the first terminal and the second terminal and electrically connects the first terminal and the second terminal to each other; and
   a resin portion which is formed by curing the thermosetting resin, and bonds the first part and the second part to each other, and includes the solder particles that do not contribute to the formation of the solder portions in a state that the solder particles are not fused with each other,
   wherein an amount of the activator is set so that the natural oxide film of the surfaces and the oxide films of the solder particles are partially but not completely removed and the solder particles that do not contribute the formation of the solder portions are covered by the remaining oxide films that are not removed by the activator and the thermosetting resin is cured while the surfaces are partially covered by the remaining natural oxide film and the solder particles are partially covered by the remaining oxide films.

6. The components joining structure according to claim 5, wherein the surfaces of the solder particles that did not contribute to the formation of the solder portions are covered by oxide films that are not removed by the activator.

7. The components joining structure according to claim 5, wherein the first terminal and the second terminal are made of copper (Cu) or a copper-based alloy.

8. A solder paste to be used in a components joining method for electrically connecting a first terminal and a second terminal to each other, wherein the first terminal and the second terminal are provided on a first part and a second part, respectively to form solder portions between the first terminal and the second terminal, wherein the surfaces of at least one of the first terminal and the second terminal are covered by natural oxide films, wherein the solder particles are covered with oxide films, and bonding the first part and the second part to each other, wherein
   the solder paste contains a thermosetting resin containing solder particles consisting mainly of tin (Sn) and a latent curing agent for curing the thermosetting resin, and further contains an activator which removes the natural oxide films of the terminal surfaces and the oxide films of the solder particles, wherein the activator is contained in the solder paste in an amount of 1 to 5 weight percent for a portion of the solder paste excluding the solder particles,
   wherein the amount of the activator is set so that the activator is capable of partially but not completely removing the natural oxide film of the surfaces and the oxide films of the solder particles, and covering the solder particles that do not contribute the formation of the solder portions by the remaining oxide films that are not removed by the activator and the thermosetting resin is curable while the surfaces are partially covered by the remaining natural oxide film and the solder particles are partially covered by the remaining oxide films.

* * * * *